United States Patent

Akiba et al.

[11] Patent Number: 5,491,301
[45] Date of Patent: Feb. 13, 1996

[54] SHIELDING METHOD AND CIRCUIT BOARD EMPLOYING THE SAME

[75] Inventors: Yutaka Akiba, Fujisawa; Kunio Matsumoto, Yokohama; Makoto Iida, Kawasaki; Takashi Maruyama, Ebina; Tsutomu Hara, Fujisawa; Hitoshi Yoshidome, Hadano; Kazuo Hirota, Chigasaki, all of Japan

[73] Assignee: Hitachi, Ltd., Japan

[21] Appl. No.: 172,413

[22] Filed: Dec. 22, 1993

[30] Foreign Application Priority Data

Dec. 28, 1992 [JP] Japan ................................. 4-347685

[51] Int. Cl.$^6$ ................................................... H05R 1/00
[52] U.S. Cl. .................... 174/250; 174/260; 174/262; 361/760; 361/761; 361/794
[58] Field of Search ............................. 174/250, 251, 174/255, 260, 261, 262, 263, 264, 265, 266; 361/760, 761, 784, 792, 794

[56] References Cited

U.S. PATENT DOCUMENTS

4,739,448  4/1988  Rowe et al. .
5,027,253  6/1991  Lauffer et al. .

*Primary Examiner*—Kristine L. Kincaid
*Assistant Examiner*—Cheryl R. Figlin
*Attorney, Agent, or Firm*—Bardehle & Partners

[57] ABSTRACT

A shielding method which utilizes a three dimensional structure and is effective to a source of the electromagnetic radiation noise, and a circuit board employing the same are obtained. Further, for the purpose of making the shielding function at an enclosure level unnecessary and realizing the recycling of enclosure materials by using this circuit board, in a circuit board structure having at least a signal layer, a power source layer and a ground layer, a signal line on the signal layer which is sandwiched between the two conductor layers made up of the power source layer and the ground layer, or the power source layers or the ground layers, is enclosed in a three dimensional manner with the conductor layers, thereby to form a single or double electrical closed loop current path or paths. By adopting this structure, there is obtained the effect that the electromagnetic radiation noise radiated from the circuit board is greatly reduced. In addition, as a result, there is obtained the effect that since the shielding processing required for the enclosure becomes unnecessary, the enclosure materials can be recycled.

12 Claims, 5 Drawing Sheets

SHIELDING METHOD AND CIRCUIT BOARD EMPLOYING THE SAME

BACKGROUND OF THE INVENTION

The present invention relates to a method of shielding the electromagnetic radiation noise, which is connected with electronic apparatuses coping with EMC which becomes increasingly important along with the development of the high speed operation and the high density of electronic devices and circuits, and a circuit board employing the same. In particular, the present invention pertains to a circuit board which is capable of making the shielding function having an enclosure level unnecessary in order to realize the recycling of enclosure materials in the electronic apparatus in which the electromagnetic shielding is performed by using a plastic enclosure.

Due to the development of high operating speed, high density electronic devices and circuits, which has increased the quantity of electromagnetic radiation noise, there has been an increase in the frequency of malfunctions in electronic apparatuses. Therefore, the VCC (Voluntary Control Council for Interference by Information Technology Equipment) standards have been established so that the noise regulation is performed. However, under the present circumstances, the technology for taking measures to cope with EMC (Electromagnetic Compatibility)/EMI (electromagnetic Interference) depends on the qualitative and empirical know-how. In some cases, there may arise problems such as the excess of the contents of the specification, the excess of the period of time for the development, and the excess of the cost required for the measure.

Two kinds of noise sources are well known which radiate noise from the circuit board of an electronic apparatus: One is the differential mode radiation in which a current I is caused to flow through an electrical closed loop formed between a signal line and a ground layer, whereby the magnetic field in the position in the vicinity of the noise source (hereinafter, referred to as "the near-by magnetic field", when applicable) is generated to radiate the noise; and the other is the common mode radiation in which an electric potential Vn, which is generated due to the ground impedance and the like by the return current flowing through the ground layer, is transmitted to a cable and the like and the electric field is generated therefrom to radiate the noise.

The differential mode radiation can be represented by the model in which the radiation is generated from a small loop antenna with the magnetic field as the radiation source. The intensity of the electric field Ed in the position away from the radiation source (hereinafter, referred to as "the remote electric field" when applicable) at this time is proportional to the current flowing through the electrical closed loop formed between the signal line and the ground layer, the loop area, and the frequency squared. Therefore, in order to reduce the noise of this type, it is necessary to reduce the current value, the frequency of the current, the higher harmonic components of the current, and the area of the loop formed in the current path.

On the other hand, the common mode radiation can be represented by the model in which the radiation is generated from a short monopole antenna with the electric field as the radiation source. The intensity of the remote electric field Ec at this time is proportional to the length of the antenna (including a cable and the like) connected to the earth, the current flowing through the cable, and the frequency of that current. Therefore, in order to reduce the noise of this type, it is necessary to reduce the values of those parameters.

For example, in the case of the double side circuit board, as shown in the circuit board for coping with EMI which is disclosed in JP-A-62-295498, a shielding electrode layer is formed through an insulating layer on a board, whereby the loop area of the differential mode radiation viewed from the outside of the board is decreased to carry out the EMI measure. In addition, as apparent from one dimensional transmission line model which is shown in the embodiment, the effect of reinforcing an earth (GND) pattern (i.e., the promotion of the low impedance) is employed. Since that shielding electrode layer corresponds in function basically to a power source layer and a GND layer in the multilayer circuit board, it is considered that the transmission characteristics and the shielding characteristics equal to those of the multilayer circuit board can be provided. However, in the prior art case of a circuit board for coping with EMI, since the basic structure is at the same level as that of the multilayer circuit board, under the present circumstances, the more excellent performance can not be expected.

Many of the prior art shielding methods are, as shown in JP-A-62-295498 as described above, based on the one dimensional model and theory. Therefore, in the case of the various methods which have been adopted as the method of shielding the electromagnetic noise, it is impossible to make an accurate estimate of the phenomena which are occurring. As a result, the shielding measure also depending on the know-how, and the effects thereof can not be quantitatively estimated. Thus, in the present circumstances, we can not expect too much of the effects.

SUMMARY OF THE INVENTION

It is therefore an object of the present invention to provide a shielding method which is effective to an object such as a circuit board having a noise source by utilizing a three dimensional structure, and a circuit board employing the same.

The present invention has the following two means basically.

(1) The energy of the electromagnetic field in the position in the vicinity of a noise source (hereinafter, referred to as "the near-by electromagnetic field", when applicable) (the differential mode radiation noise) which has been generated from the noise source is absorbed up macroscopically at the time when the near-by electromagnetic field has arrived at a frame conductor. On the basis of the energy of the near-by electromagnetic field thus absorbed, a high frequency current is caused to flow on the frame conductor forming an electrical closed loop current path having a three dimensional structure to be effectively converted into the eddy current loss and the absorption loss (e.g., the magnetic substance loss, the dielectric loss or the like), which thereby reduces the differential mode radiation noise.

(2) At this time, since the change in the electric potential is caused normally on the frame conductor by the flowing of the high frequency current which generates the common mode radiation noise the frame conductor is designed so as to have a double shielding structure through an insulating layer such that the common mode radiation noise, which can not be cancelled by an inner frame conductor, is shut up by an outer frame conductor to be reduced. In the case where the quantity of noise is sufficiently reduced by the impedance of the inner frame Conductor and the magnitude of the high frequency current, the outer frame conductor, i.e., the double shielding structure, becomes unnecessary.

If the energy of the near-by electromagnetic field (the differential mode radiation noise) is necessary in order to propagate the high speed signal, then the shielding method of converting effectively the energy generated into the eddy current loss and the like without influence on the high speed signal is also necessary.

The shielding effect can be obtained in the following manner: A current is induced on the frame conductor composed of a shielding plate or the like by the incoming electromagnetic field to generate the electromagnetic field serving to cancel the original electromagnetic field, thereby to obtain the shielding effect. At the time when the electromagnetic wave (the electromagnetic field) has arrived at the surface of the conductor, a part of the electromagnetic wave is reflected by the surface of the conductor, and the remaining part thereof is propagated through the conductor to be attenuated. The former is called the reflection loss and the effect thereof depends on the electric field, the magnetic field and the surge impedance. On the other hand, the latter is called the absorption loss and shows the same effect independently of the near-by electromagnetic field, the electromagnetic field in the position away from the noise source (hereinafter, referred to as "the remote electromagnetic field" when applicable), the electric field and the magnetic field. Actually, in the frequencies equal to or higher than the several MHz, the absorption loss occupies the greater part of the total losses, and therefore, the frame conductor needs to have a thickness enough to obtain sufficiently the shielding effect. This absorption loss corresponds to the eddy current loss and the like which are caused by the current which is induced in the medium when propagating the electromagnetic wave through the conductor and the like. The absorption loss of the shielding plate in the one dimensional model is about 9 dB per unit skin depth (the penetration depth) $\delta$. Therefore, as long as the conductor has the same thickness, the shielding effect is enhanced as the frequency is higher. However, as the actual problem, since the perfect sealed shielding structure is not present, the proper shielding effect depending on the characteristics of the material itself can not be obtained but the shielding effect depends on the opening portion such as the joint. The discontinuity of the shielding plate having the opening portion reduces the shielding effect because it serves to cause the induced currents flowing on the shielding plate to flow in the different paths. In terms of phenomena, since the impedance of the shielding plate is partially increased by the presence of the opening portion, the induced currents which serve to cancel the electromagnetic field are decreased to reduce the shielding effect. Under the condition of the one dimensional model, it will be important that basically, the influence of the opening portion on the current paths along which the induced currents are caused to flow is reduced as much as possible.

The first means of the present invention is provided by taking both the occurrence structure and the occurrence method of the induced currents (the eddy currents) into consideration in terms of the three-dimension in the shielding phenomena of the electromagnetic field. That is, the first means of the present invention may provide that the high frequency currents composed of the induced currents for cancelling the electromagnetic field are sufficiently given, and thus the optimal shielding conditions are provided. In other words, by the formation of the electrical closed loop current paths having the three dimensional structure which can not be explained on the basis of the one dimensional model, the impedance is effectively decreased to promote the increasing of the high frequency current for cancelling the electromagnetic field. With respect to the high frequency currents generated at that time, the frequency range thereof is determined by the configurations of the current paths formed by the closed loop conductor, and the like. The differential mode radiation noise as the energy of the near-by electromagnetic field is cancelled by the high frequency currents based on the induced currents, and at the same time, the eddy current loss and the like are effectively caused, thereby to enhance the shielding effect.

On the other hand, the high frequency currents are caused to flow on the closed loop current paths, whereby the change in the electric potential is generated on the conductor (i.e., the shielding plate), and then the electromagnetic radiation noise (the common mode radiation noise) is partially generated. At this time, in the case where the high frequency currents are excessively caused to flow on the closed loop current paths, which increases the above-mentioned electromagnetic radiation noise (the common mode radiation noise), there are several known methods of suppressing the large electromagnetic radiation noise.

One of them is a method wherein Q of the circuit formed by the closed loop current paths is reduced to decrease the high frequency current. For example, the conductivity of the conductor material forming the closed loop current paths is decreased, whereby the proper high frequency currents can be given to the shielding of the electromagnetic radiation noises (the common mode radiation noise and the differential mode radiation noise).

Another method is a method wherein a wave absorber for absorbing the radio wave, which is made of the dielectric or the magnetic substance, is arranged in a position where the loop impedance is especially large in the closed loop current paths (e.g., the position in the vicinity of an interlayer connection portion of a multilayer circuit board, and the like), and thus, the electromagnetic radiation noise is effectively absorbed by the wave absorber.

The second means of the present invention may provide that the double closed loop current paths are sufficiently closely formed through an insulating layer, whereby the shielding of the above-mentioned electromagnetic radiation (the common mode radiation noise) is realized. In other words, by adopting the double shielding structure forming the closed loop, the electric field in the position in the vicinity of the noise source (hereinafter, referred to as "the near-by electric field", when applicable) (the common mode radiation noise) which is generated in the inner conductor is absorbed in the outer conductor, thereby to shield the electromagnetic radiation noise.

DESCRIPTION OF THE PREFERRED EMBODIMENTS

The preferred embodiments of the present invention will hereinafter be described in detail with reference to the accompanying drawings.

Figure 1:
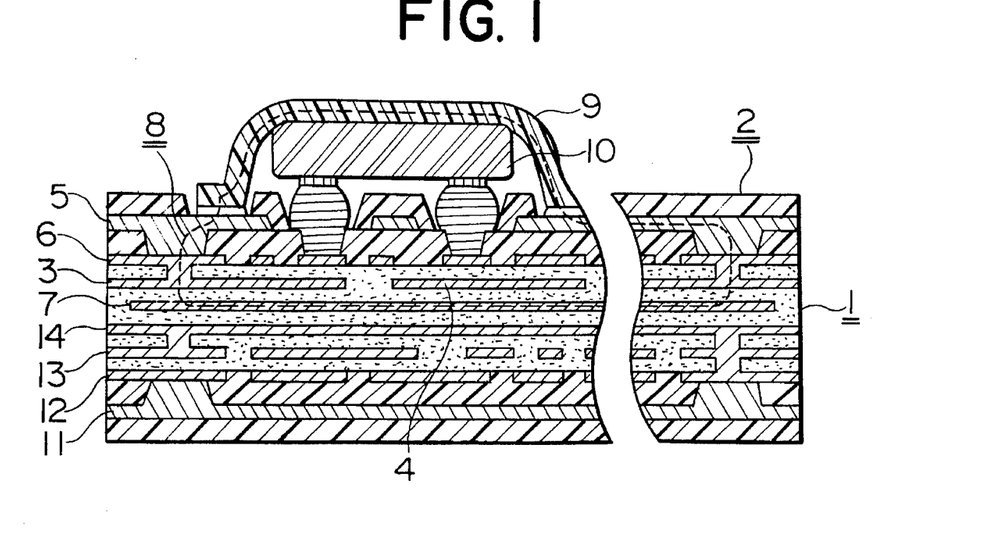
FIG. 1 is a cross sectional view showing a structure of a multilayer circuit board employing a shielding method of the present invention.

FIG. 1 is one of the preferred embodiments of the present invention and shows the main portion of a cross sectional view of a circuit board 2 having an eight layer structure in which a multilayer circuit board 1 having six layers (S1, S2, V, G, S3 and S4) are sandwiched between upper and lower external ground layers (G01 and G02).

In the circuit board 2, a three dimensional closed loop path 8 which is necessary for the shielding of the electromagnetic field is formed. In particular, for the high frequency range requiring the shielding, normally, the impedance of the connection portion between the layers forming the closed loop current path 8 needs to have a resistance equal to or lower than several ohms. Therefore, there are employed the means such as the increasing in the area of the pattern overlapping portion between the layers, the close arrangement of a plurality of via-conductors, and the line connection structure.

For example, paying attention to a signal line 4 (a line through which a high speed signal such as a clock is transmitted, or the like) of a signal layer (S2) 3 as one of the noise sources, by adopting a four layer structure made up of an external ground layer (G01) 5, a signal layer (S1) 6, a signal layer (S2) 3 and a power source layer (V) 7, a structure in which the signal line 4 is enclosed in a three dimensional manner therewith, i.e., an electrical closed loop current path 8 is formed.

Figure 9:
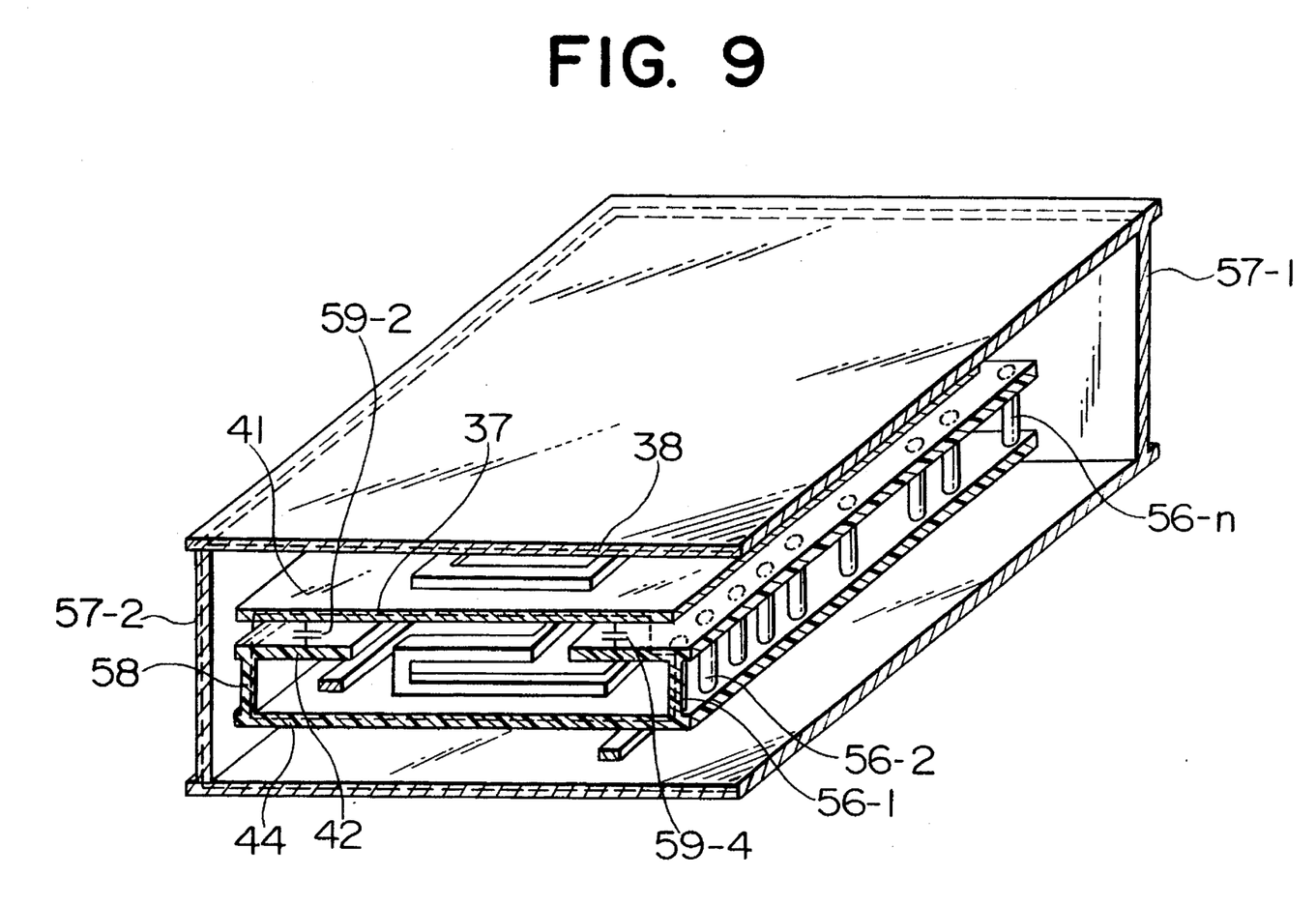
FIG. 9 is a perspective view showing a structure of an interlayer connection portion of a circuit board 35 forming both closed loop current paths 37 and 38.

In the case of the signal layer (S2) 3 and the power source layer (V) 7, the area of the pattern overlapping portion is increased in the peripheral portion of the circuit board 2, thereby to electrically connect the two layers 3 and 7 through a capacitive coupling. The thick pattern of the power source layer (V) 7 needs to be electrically isolated from the closed loop circuit path 8 in terms of a direct current. In addition, the peripheral portions of the signal layer (S1) 6 and the signal layer (S2) 3 are respectively connected to the associated layers by the structure in which the low impedance is promoted by the means such as via-conductor and a line connection structure as shown in FIG. 9. FIG. 9 will be described later. However, those peripheral portions may also be electrically connected to the associated layers, respectively, through the capacitive coupling. The external ground layer (Gd) 5 and the signal layer (S1) 6 are electrically connected to each other in the peripheral portions of the layer by utilizing the capacitive coupling, the through holes and the like. In particular, in the case of the external ground layer (G01) 5, a large number of components such as LSIs, ICs and chips may be mounted on the surface of the circuit board 2 in some cases, and as a result, the formation of the closed loop current path 8 may become difficult in some cases. In such cases, the mounted components 10 are sealed with a conductor cap 9 connected to the external ground layer (G01) 5 to secure the desired closed loop current path 8. The connection portion between the conductor cap 9 and the external ground layer (G01) 5 is performed by using the solder or the conductive adhesive agent. In the case where the mounted components 10 need to be repaired, by taking particularly the electrical connection and the like in the form of the capacitive coupling into consideration, it is not necessary to employ the conductive adhesive agent as the connection material.

In addition, in order to make the mounting of the conductor cap 9 easy, a flat sheet-like cap may be employed in some cases. That is, there may be employed the flat structure in which the chips and the like are mounted on a recess portion provided in the circuit board 2, and then the chips and the like thus mounted are sealed with the flat sheet-like cap.

The external ground layer (G01) 5 on the circuit board 1 is formed by applying directly the conductive coating (the paste) to the circuit board 1, or by sticking the copper simple substance, a copper-metallic foil plated with Ni/Au, or the like on the circuit board 1. Further, in order to increase the strength of the external ground layer (G01) 5 by taking the repair, the assembly and the like into consideration, there may also be employed a method wherein a sheet (including patterns other than the thick pattern because normally, the I/O portion, the component connection portion and the like are present) is previously formed in which the above-mentioned metallic foil sheet or the conductive coating as the external ground layer (G01) 5 is stuck, applied or printed on or to an insulating sheet as the outset insulating layer (its reference numeral is omitted here) to integrate them with each other, and the resultant sheet is applied to the circuit board 1. In this case, in the vicinity of the interlayer connection portion and the like in which the electromagnetic radiation noise is easy to leak out, a sheet-like wave absorber (made of the ferromagnetic substance, the magnetic substance or the combination thereof) is arranged (not shown) so that the electromagnetic radiation noise is effectively absorbed by the wave absorber. Likewise, such a wave absorber may also be arranged in the vicinity of the interlayer connection portion in the circuit board 1.

In addition, as one of methods of forming the above-mentioned conductor cap 9, there may be employed in some cases a sheet in which the metallic foil sheet, or the conductive coating is stuck, applied or printed on or to the above-mentioned insulating sheet to integrate them with each other. Further, by employing the integral sheet doubly, the local double shielding may be performed to enhance the shielding effect in some cases.

Figure 2:
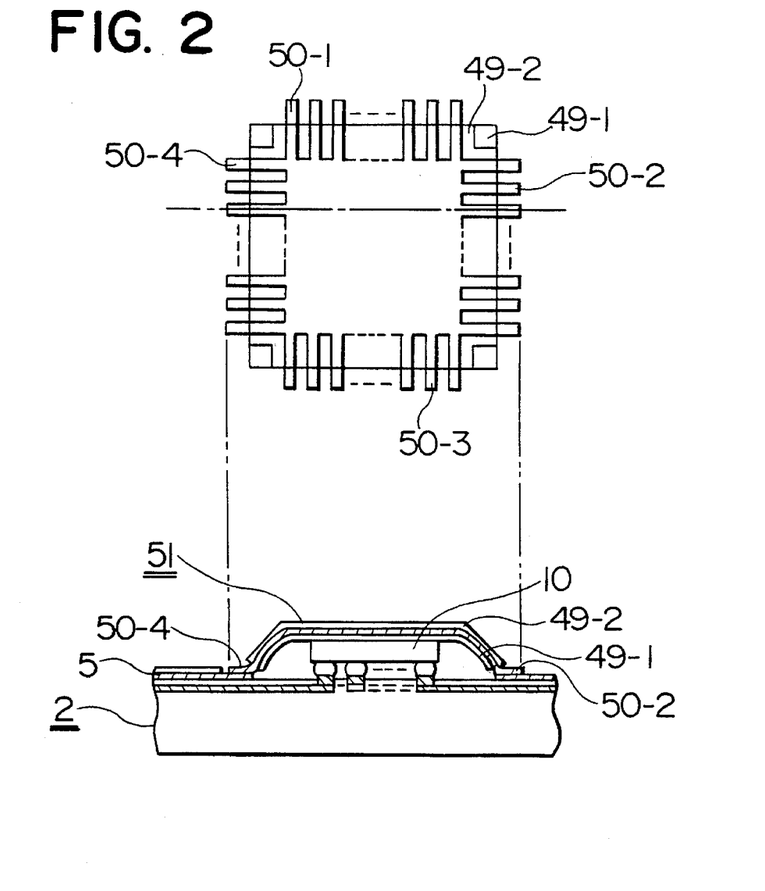
FIG. 2 is a plan view and a cross sectional view each showing a conductor cap 51(9) mounted by the tape carrier technique, and the connection structure thereof.
Figure 3:
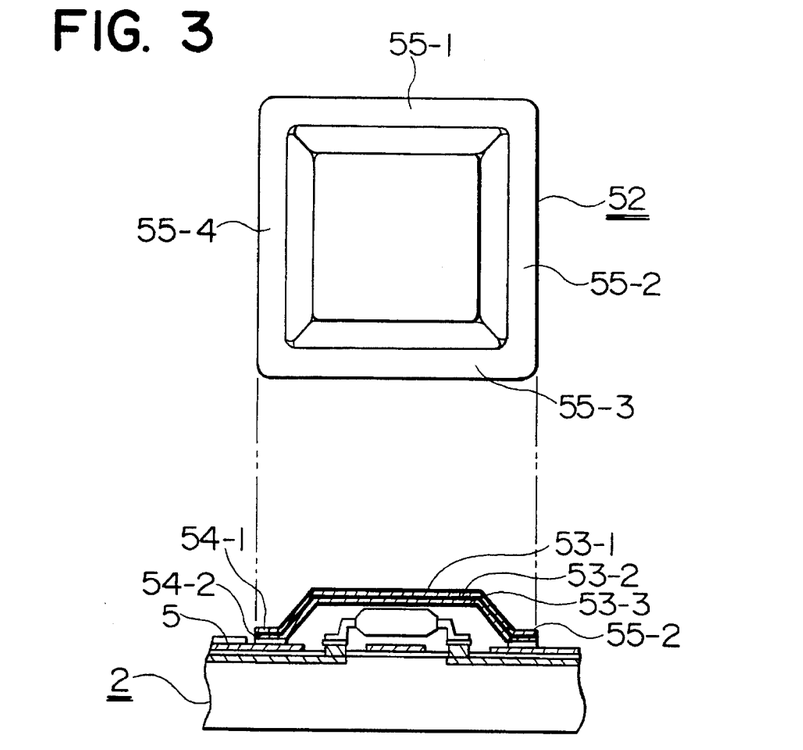
FIG. 3 is a plan view and a cross sectional view each showing a conductor cap 52 (9) formed by shaping a metallic foil having a double structure thereinto, and the connection structure thereof.

FIG. 2 is a plan view and a cross sectional view each showing an example of the conductor cap 9 and the connection structure thereof. FIG. 3 is a plan view and a cross sectional view each showing another embodiment of the conductor cap 9 and the connection structure thereof. In each of the figures, the shielding for the circuit board is enhanced by mounting the conductor cap 9. FIG. 2 shows a conductor cap 51 (9) formed by the tape carrier technique or the like which has bare connection leads 50-1, 50-2, 50-3 and 50-4 extending in the four directions, respectively, and in which a conductor layer is sandwiched between two insulating layers 49-1 and 49-2. In this case, the external ground layer 5 (refer to FIG. 1) and the connection leads 50 are tabconnected to each other by Au/Sn, the low melting point solder, the conductive adhesive agent or the like, thereby to enhance the shielding for the circuit board 2 including the mounted components 10. A conductor cap 52 (9) shown in FIG. 3 is formed by shaping metallic foils 54-1 and 54-2 having a double structure in which portions other than the electrical connection portions electrically connected to the ground layer 5 are electrically insulated by insulating layers 53-1, 53-2 and 53-3 into a fixed structure. In this case, the connection portions 55-1, 55-2, 55-3 and 55-4 and the external ground layer 5 are connected to each other by Au/Sn or the solder using the thermal compression bonding technique.

On the other hand, the four layer structure which is made up of an external ground layer (G01) 11, a signal layer (S4) 12, a signal layer (S3) 13 and a ground layer (G) 14 has also the same function as that of the four layer structure which is made up of the external ground layer (G01) 5, the signal layer (S1) 6, the signal layer (S2) 3 and the power source layer (V) 7.

Figure 4:
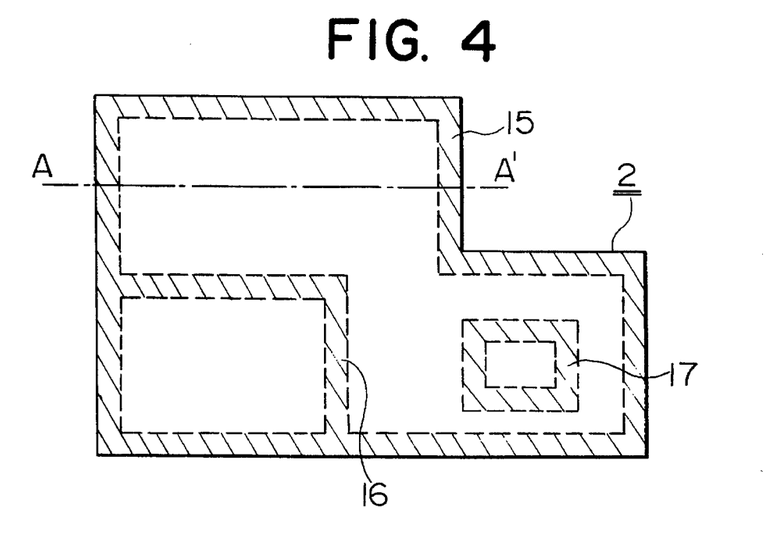
FIG. 4 is a plan view of a multilayer circuit board and shows an electrical connection portion between layers for forming a closed loop current path 8.

FIG. 4 is an example of a plan view showing the area of the pattern overlapping portions between the layers for forming the electrical closed loop current path 8 in the above-mentioned circuit board 2, and the electrical connection portions such as the via-conductor. A line A–A' of the circuit board 2 shows the cutting portion giving the cross sectional view of FIG. 1.

In this case, the electrical connection portions such as the pattern area overlapping portions and the via-conductors include, in addition to a peripheral portion 15 of the circuit board 2, portions 16 and 17 so as to control the resonance frequency region. The electrical closed loop current path 8 is locally formed to enhance the shielding effect. For the portion in the vicinity of the peripheral portion 15, in particular, in order to prevent the leakage of the electromagnetic wave, the wave absorber may be arranged and formed between the layers in same cases (not shown).

The electrical connection portion 17 has the double shielding structure against the noise source (not shown), thereby to enhance the shielding effect. In particular, in the present embodiment, the areas of the pattern overlapping portions approximately coincide with one another with respect to the whole layers. However, for the purpose of providing the effective shielding by taking the resonance frequency region and the like into consideration, such coincidence in the area is not necessarily required. In the pattern area overlapping portions in the peripheral portion 15 and the like of the circuit board 2, for the purpose of reducing the pattern area required for promotion of the low impedance of the electrical connection portion, the miniaturization of the circuit board 2, and the like, in particular, the dielectric constant of the insulating layer (refer to FIG. 1) of the circuit board 2 may be made from several times to several ten times as large as that of the other pattern peripheral portions in some cases. In addition, in order to electrically connect the layers to one another in the peripheral portion 15 of the circuit board 2, there is also known a method wherein the conductive adhesive agent is applied to the side face of the circuit board 2, or one or more chip capacitors are mounted thereto. In this case, since the above-mentioned means for electrically connecting the layers to one another is omitted or simplified, there is the advantage that the circuit board 2 can be miniaturized, and so forth. But, the layers such as the power source layer (V) 7 are, as described above, connected to each other through the capacitive coupling.

Figure 5:
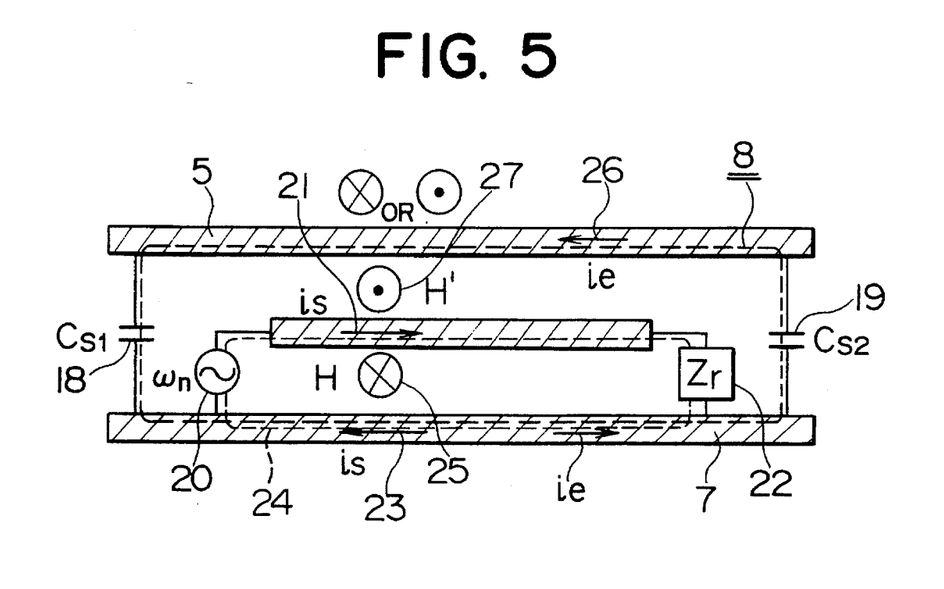
FIG. 5 is a view showing an equivalent model of a three dimensional closed loop current path 8.

FIG. 5 is a view showing an equivalent model representing the three dimensional closed loop circuit path 8 having the four layer structure made up of the external ground layer (G01) 5, the signal layer (S1) 6, the signal layer (S2) 3 and the power source layer (V) 7. In this connection, the power source layer (V) 7 acts as a reflecting plate (providing the mirror effect) for the signal layer (S2) 3 having the signal line 4 of interest and thus forms a current path through which the return current is caused to flow. In the equivalent model, the external ground layer (G01) 5 and the power source layer (V) 7 are electrically connected to each other through capacitance components (Cs1) 18 and (Cs2) 19 in the peripheral portion 15 of the circuit board 2, thereby to form the closed loop current path 8. There is also known a model in which instead of the capacitance components (Cs1) 18 and (Cs2) 19, the impedance components associated with the via-conductors are taken into consideration. However, since this model can be treated similarly, the description thereof is omitted here for the sake of simplicity. A signal current (is) 21 flowing from a fixed signal source (ωn) 20 into a terminal load (Zr) 22 causes a return current 23 to flow through the power source layer (V) 7. At this time, a near-by magnetic field 25 which has been radiated from a closed loop signal circuit 24 generates an induced current (ie) 26, i.e., a near-by magnetic field 27 of opposite polarity on the above-mentioned closed loop current path 8 through the magnetic coupling (the inductive coupling) so as to cancel the near-by magnetic field 25. As the frequency is higher, the coupling coefficient k approaches 1 by the skin effect and the like and thus the cancelling (shielding) effect is enhanced. At this time, the closed loop current path 8 through which the induced current (ie) 26 flows becomes the secondary circuit in the transformer model and thus generates effectively the dielectric loss, the magnetic substance loss and the eddy current loss.

Figure 6:
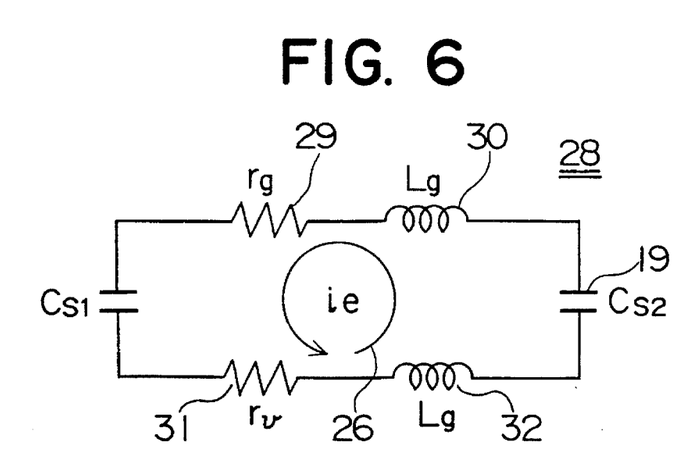
FIG. 6 is an equivalent circuit diagram showing a circuit model of the three dimensional closed loop current path 8.

FIG. 6 shows a circuit model 28 of the above-mentioned closed loop current path 8. In this circuit model, the external ground layer (G01) 5 through which the induced current (ie) 26 flows is equivalently replaced with a resistance component (rg) 29 and an inductance component (Lg) 30 connected in series with each other, the power source layer (V) 7 is equivalently replaced with a resistance component (rv) 31 and an inductance component (Lv) 32 connected in series with each other, and the peripheral connection portions between the external ground layer (G01) 5 and the power source layer (V) 7 are equivalently replaced with capacitance components (Cs1) 18 and (Cs2) 19. The region of the resonance frequency at that time depends on the structure of the closed loop current path 8 and is basically expressed by using the term of resonance and antiresonance. The closed loop current path 8 absorbs the energy of the near-by magnetic field 25 through the magnetic coupling, whereby a high frequency current (26+33) which is obtained by adding a resonance current 33 (shown in FIG. 7) to the induced current (ie) 26 is generated within the above-mentioned specific frequency region.

Figure 7:
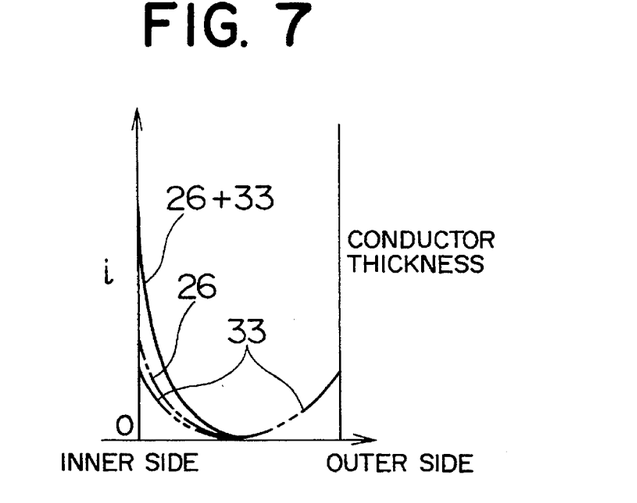
FIG. 7 is a view showing the current density distribution of high frequency currents with respect to a conductor thickness.

FIG. 7 is a graphical representation showing the current density distribution of the high frequency current (26+33) with respect to the thickness of the external ground layer (G01) 5.

While the resonance phenomenon occurs, the high frequency current (26+33) as the sum of the induced current 26 and the resonance current 33 on the above-mentioned closed loop current path 8 is also caused to flow into the outside of the external ground layer (G01) 5. Therefore, the change in the electric potential is caused on the conductor of the external ground layer (G01) 5, and thus an electromagnetic radiation noise (the common mode radiation noise) is generated. In order to suppress this common mode radiation noise, Q of the circuit model 28 formed by the above-mentioned closed loop current path 8 is reduced to decrease the resonance current 33. In this case, the conductivity of the conductor material which is employed in the external ground layer (G01) 5 forming the closed loop current path 8 is reduced (about several ohms/□ in the sheet resistance), and thus the proper shielding effect is provided against the electromagnetic radiation noise (including the common mode radiation noise and the differential mode radiation noise).

Figure 8:
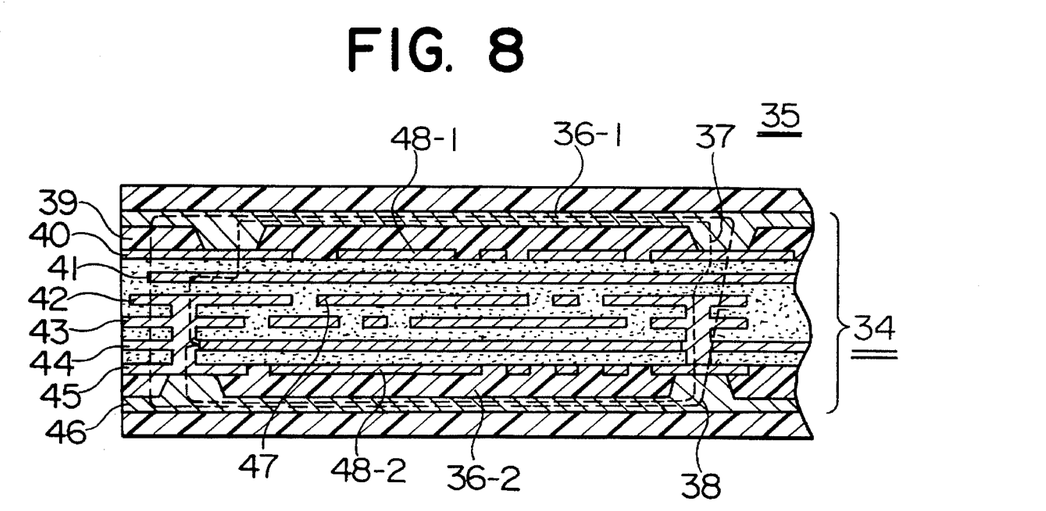
FIG. 8 is a cross sectional view showing a structure of a multilayer circuit board employing the shielding method of the present invention in a multilayer circuit board having a structure in which two signal layers are sandwiched between a power source layer and a ground layer.

FIG. 8 is another embodiment of the present invention and shows a part of a cross sectional view of a circuit board 35 having an eight layer structure in which a multilayer circuit board 34 having the six layers (S1, V, S2, S3, G and S4) is sandwiched between the upper and lower external ground layers (G01 and G02). In the circuit board 35, the illustration of the parts mounted on the surface of the board is omitted here for the sake of simplicity.

In the circuit board 35, a plurality of three dimensional closed loop current paths required for the shielding are formed. In particular, there are employed the means such as the increasing in the area of the pattern overlapping portion in the layers, the formation of a plurality of via-conductors, the adoption of the line connection structure, and the like such that for the high frequency region requiring the shielding, the impedance of the connection portion between the layers forming the closed loop current path is normally equal to or lower than several ohms.

For example, paying attention to a signal line 47 (a line through which the high speed signal such as a clock is transmitted, and the like) of a signal layer (82) 42 as one of the noise sources, there is formed the structure in which the signal line 47 is electrically enclosed with the four layer structure made up of, out of the layer structure of the circuit board 34, a power source layer (V) 41, the signal layer (S2) 42, a signal layer (S3) 43 and a ground layer (G) 44, i.e., a three dimensional closed loop current path 37. In addition, the closed loop current path 38 is formed by the eight layer structure, i.e., the layer structure of the circuit board 35 in which the multilayer circuit board 34 is sandwiched between the upper and lower ground layers (G01) 39 and (G02) 46, whereby the double shielding structure is provided. Thus, the double shielding structure is adopted by using the eight layer structure of the circuit board 35, whereby for other signal lines (the noise sources) as well, such as a signal line 48-1 of a signal layer (S1) 40 and a signal line 48-2 of a signal layer (S4) 45, closed loop current paths 36-1 and 36-2 are simultaneously realized, respectively. In particular, in the case of the line through which the high speed signals such as a clock is transmitted, those closed loop current paths are positively arranged in the signal layer (S2) 42 and the signal layer (S3) 43 to provide the double shielding structure, whereby the electromagnetic radiation noise is greatly reduced.

FIG. 9 shows a structure of the interlayer connection portions mainly with respect to the power source layer and the ground layers of the circuit board 35 in the embodiment shown in FIG. 8. In the case where the three dimensional closed loop current paths 37 and 38 (showing the double loops in one cross sectional structure) are formed, in order to reduce the impedance of the connection portion between the ground layer 44 and the signal layer 42 formed by the thick patterns, there are employed the structure in which a plurality of through holes 56-1, 56-2, . . . , 56-n are arranged continuously as much as possible (with the high density) and in a straight line, and the structure in which a line partition wall 58 is provided (in the figure, the illustration of the connection structure of the remaining two sides is omitted). In the case of the closed loop current path 38, line partition walls 57-1 and 57-2 (the illustration of line partition walls 57-3 and 57-4 is omitted in the figure) are employed. The parts to be mounted, an I/O portion and the like are connected to the circuit board 35. However, the illustration of those parts and the portion is omitted in the figure for the sake of simplicity. Thus, there is adopted the structure in which the change in the impedance in the three dimensional closed loop current paths 37 and 38 is basically small. On the other hand, with respect to the connection between the power source layer 41 and the signal layer 42 formed of the thick pattern, the area of the pattern overlapping portion is increased to promote the reduction of the impedance through capacitive couplings 59-2 and 59-4 (the illustration of capacitive couplings 59-1 and 59-3 is omitted in the figure).

In the present embodiment, the six layer circuit board and the eight layer circuit board which is constructed on the basis of the six layer circuit board are adopted as the object of the description. However, in the double side circuit board as well, the three or four layer circuit board including the external ground layers are formed, whereby the structure in which the signal line is electrically enclosed, i.e., the three dimensional closed loop current path can be formed. Therefore, it is possible to obtain the sufficient shielding effect.

In addition, the application of the shielding methods shown in the above-mentioned embodiments is not limited to only the circuit board. That is, for example, the shielding method is also applicable to the devices (such as LSIs, ICs, MCMs (Multi Chip Modules) and the like) to be mounted on the circuit board and the modules. Such devices and modules are mounted on the circuit board of the present invention, whereby it is possible to further enhance the shielding effect.

AS set forth hereinabove, according to the present invention, there is provided the effect that in a circuit board structure having at least a signal layer, a power source layer, and a ground layer, a signal line on the signal layer, which is sandwiched between the two conductor layers made up of the power source layer and the ground layer, or the power source layers or the ground layers, is enclosed in a three dimensional manner with the two conductor layers, thereby to form the single or double electrical closed loop current path or paths, whereby the electromagnetic radiation noise can be greatly reduced. In addition, as a result, since the shielding processing required for the enclosure becomes unnecessary, there is also provided the effect that the enclosure materials can be utilized in a recycling manner.

We claim:

1. A circuit board comprising:

a power source layer;

a ground layer;

a signal line positioned between said power source layer and said ground layer; and conductor patterns positioned in the peripheral portions of the signal line, wherein said power source layer and said ground layer are positioned at the upper and lower surfaces of said signal line and said conductor patterns, and said power source layer is capacitively coupled with said ground layer through said conductor patterns in the peripheral portions of said signal line, and said signal line is enclosed in a three dimensional manner, thereby to form a shielding structure.

2. A circuit board according to claim 1, wherein said power source layer and said conductor patterns have an overlapping portion.

3. A circuit board according to claim 1, wherein a part of said ground layer forms a conductor cap.

4. A circuit board according to claim 1, wherein said power source layer is electrically connected with said conductor patterns through a plurality of through holes.

5. A circuit board according to claim 1, wherein said ground layer is electrically connected with said conductor patterns through a plurality of through holes.

6. A circuit board according to claim 1, wherein said ground layer is electrically connected with said conductor patterns by utilizing line partition walls.

7. A circuit board according to claim 1, wherein an impedance at a capacitive coupling part is made lower than several ohms for a high frequency region requiring shielding.

8. A circuit board comprising:

a first power source layer;

a first ground layer;

a signal line positioned between said first power source layer and said first ground layer;

a first conductor pattern positioned in the peripheral portions of the signal line;

a second conductor pattern positioned in the outer peripheral portions of said first conductor pattern;

a second ground layer positioned at a lower surface of said first power source layer; and a second power source layer positioned at an upper surface of said first ground layer, wherein said first ground layer and said first power source layer are positioned at the upper and lower surfaces of said signal line and said first conductor pattern, and said first power source layer is capacitively coupled with said first ground layer through said first conductor pattern in the peripheral portions of said signal line, and said signal line is enclosed in a three dimensional manner thereby to form a first shielding structure, and said second power source layer and said second ground layer are positioned at the upper and lower surfaces of said first shielding structure, and said second power source layer is capacitively coupled with said second ground layer through said second conductor pattern in the peripheral portions of said signal line thereby to form a second shielding structure enclosing said first shielding structure in a three dimensional manner.

9. A circuit board according to claim 8, wherein said second ground layer, said second power source layer and said second conductor pattern have an overlapping portion.

10. A circuit board according to claim 8, wherein said second ground layer is electrically connected with said second conductor pattern through a plurality of through holes.

11. A circuit board according to claim 8, wherein said second power source layer is electrically connected with said second conductor pattern through a plurality of through holes.

12. A circuit board according to claim 8, wherein said first conductor pattern and said second conductor pattern are made common.

* * * * *